United States Patent
Marchais et al.

(10) Patent No.: US 12,445,771 B2
(45) Date of Patent: Oct. 14, 2025

(54) IMPEDANCE TRACKING FOR CONNECTOR BETWEEN SOURCE AND LOAD

(71) Applicant: Cirrus Logic International Semiconductor Ltd., Edinburgh (GB)

(72) Inventors: Emmanuel A. Marchais, Dripping Springs, TX (US); Ziyan Zou, Austin, TX (US); Chin Huang Yong, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 294 days.

(21) Appl. No.: 18/353,092

(22) Filed: Jul. 16, 2023

(65) Prior Publication Data

US 2025/0024197 A1    Jan. 16, 2025

(51) Int. Cl.
*H04R 3/00* (2006.01)
*H04R 29/00* (2006.01)

(52) U.S. Cl.
CPC ............. *H04R 3/00* (2013.01); *H04R 29/001* (2013.01)

(58) Field of Classification Search
CPC ..... H02J 7/007192; G01R 27/16; H04R 3/00; H04R 29/001
USPC ...................................................... 381/58, 59
See application file for complete search history.

(56) References Cited

U.S. PATENT DOCUMENTS

2021/0170891 A1    6/2021   Lee et al.
2021/0249868 A1*   8/2021   Lan ..................... B60L 3/0046

FOREIGN PATENT DOCUMENTS

CN         102043095 A      5/2011
CN         111722116 A      9/2020

* cited by examiner

*Primary Examiner* — Paul Kim
(74) *Attorney, Agent, or Firm* — Norton Rose Fulbright US LLP

(57) ABSTRACT

The impedance of a connector, such as a flex cable, between a source and load affects the temperature and power consumption within an electronic system, such as a mobile device. According to embodiments described in this disclosure, the impedance of the flex cable may be separately tracked from the impedance of the source, which provides for improved power management within the electronic system. The impedance of the flex cable may be factored into determining a maximum available power to the load. The impedance of the flex cable may also be mapped to a temperature and used to manage power to maintain operation within temperature limits. Additional aspects of power management and impedance tracking for a connector are described herein.

20 Claims, 3 Drawing Sheets

IMPEDANCE TRACKING FOR CONNECTOR BETWEEN SOURCE AND LOAD

FIELD OF THE DISCLOSURE

The instant disclosure relates to power management in mobile devices. More specifically, portions of this disclosure relate to managing temperature changes resulting from power consumption in mobile devices.

BACKGROUND

Electrical systems generate heat when current passes through resistances. The heat causes an increase in temperature in the electrical system if the dissipation capacity is less than the generated heat. Components in electrical systems can fluctuate in temperature over time based on operating conditions for the electrical system. For example, processors increase in temperature for a period of time when performing a large set of calculations due to larger current consumption but decrease in temperature when the processor idles due to lower current consumption. Rising temperatures in components can have negative effects, such as decreasing reliability and/or potential damage to those components. Although the processor is one example of an electrical component that generates heat, any power transfer from a source to a load can be affected by temperature.

SUMMARY

Components that present a resistance to a power source can also include connectors. Flex connectors are long cables (e.g., 1 cm or more) containing a number of conductors encapsulated in an insulator material. The flex connector includes an interface at each end to couple directly to a component or indirectly to another component through a connector of a printed circuit board. The impedance of the connector, such as the flex connector, also affects the temperature and power consumption within the electronic system, and the impedance of the flex connector varies based on factors such as current and temperature. Conventional power management techniques that do not account for the dynamic nature of the impedance of the connector may provide inefficient management of power that can lead to dangerous operating conditions. For example, high temperatures at a battery cell caused in part by the impedance of the connector can degrade battery performance and possibly lead to short circuits within the battery and unsafe conditions. Embodiments of this disclosure provide techniques for tracking impedance of the connector to provide improved information regarding power consumption in the electronic system.

Shortcomings mentioned here are only representative and are included simply to highlight that a need exists for improved electrical components, particularly for power management employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

In certain operational conditions, the connector impedance (e.g., a contact resistance) may dominate total resistance (e.g., ~30 mOhm connector impedance vs. 6 mOhm source impedance). A power prediction of the instantaneous power available from a source (e.g., battery cell) based on the source impedance alone could include a significant error if the connector impedance is not estimated accurately. Further, the connector impedance is temperature dependent, and the connector temperature changes may be faster than the source temperature. For example, a flex connector thermal time constant may be fifty times faster than the cell thermal time constant. Aspects of embodiments described herein provide for different tracking capabilities for source and connector impedance to improve the estimate of power available to a load of an electronic system. The tracking may separate the source impedance seen by the load into a connector impedance and a cell impedance to allow implementation of tracking algorithms with bandwidth capabilities and/or time constants configured for each impedance part. This improved impedance determination and power estimate may improve control of power within the electronic system and improve safety of operating the electronic system. Further, the separate tracking may reduce signal-to-noise ratio (SNR) requirements on a sense path for measuring voltages in the electronic system.

Another benefit, in addition to the improved power management, may be improved granularity of fault detection. For example, a flex connector may be damaged during phone repair or battery cell replacement. As another example, a short condition may occur inside the flex connector (such as due to improper handling during installation and or impact damage). The separate tracking according to some embodiments of this disclosure may separate battery cell aging impedance increases from a total impedance for easier cell health diagnostic.

Electronic devices incorporating the power management described above may benefit from better user experience, such as prolonged battery life for the electronic device, reduced skin temperature of the electronic device, and safer operation of the electronic device by reducing potential runaway conditions that may result in fires. Integrated circuits of the electronic devices may include an audio controller with the described functionality. For example, audio circuitry including one or more of a power amplifier, an analog-to-digital converter (ADC), or a coder/decoder (CODEC) implemented in an audio controller may be coupled to a battery source through a flex connector. Such an audio controller may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

According to some embodiment, a method of impedance tracking and/or power management may include performing operations in circuitry and/or logic that cause receiving a first voltage value corresponding to a first voltage at a first side of a connector coupling a source to a load, a second voltage value corresponding to a second voltage at a second side of the connector, and a current value corresponding to current flow from the source to the load through the connector; determining a first impedance corresponding to the source based on the first voltage value and the current value; determining a second impedance corresponding to the connector based on the second voltage value and the current value; and/or controlling power consumption in the system based on the first impedance and the second impedance.

In certain embodiments, determining the first impedance comprises determining a first dynamic impedance having a first time constant, and determining the second impedance comprises determining a second dynamic impedance having a second time constant. For example, determining the first dynamic impedance may include applying a first averaging filter with a first time constant to an impedance determined based on the first voltage value and the current value, and determining the second dynamic impedance may include applying a second averaging filter with a second time constant shorter than the first time constant to an impedance determined based on the second voltage value and the current value.

In certain embodiments, the method of impedance tracking and/or power management may be performed in an electronic system, such as a mobile device, to track the impedance of a flex cable separately from a battery cell that is coupled to the flex cable and used to supply power to a load, such as an audio controller and/or loudspeaker. In another example, the source may be a speaker driver or other power driver integrated circuit (IC) and the load is an electromechanical load such as a speaker coil or electromechanical haptic actuator coupled to the driver through a flex cable.

The controlling performed by the method may include determining an available maximum power to the load and controlling the load based on the available maximum power. The controlling performed by the method may include determining a first temperature corresponding to the source; determining a second temperature of the connector based on the second impedance (e.g., of a flex cable), and controlling at least one of the load or the source based on determining a difference between the first temperature and the second temperature exceeds a threshold level.

In some embodiments, aspects of the methods described in this disclosure may be embodied as computer-executable code that may be stored in memory such that at least one processor coupled to the memory and configured to execute the computer-executable code is caused by the computer-executable code to perform operations described herein. For example, the computer-executable code may cause the at least one processor to perform operations including receiving a first voltage value corresponding to a first voltage at a first side of a connector coupling a source to a load, a second voltage value corresponding to a second voltage at a second side of the connector, and a current value corresponding to current flow from the source to the load through the connector; determining a first impedance corresponding to the source based on the first voltage value and the current value; determining a second impedance corresponding to the connector based on the second voltage value and the current value; and/or controlling power consumption in the system based on the first impedance and the second impedance. The computer-executable code may also cause the at least one process to perform any one or combination of operations described according to embodiments disclosed herein.

According to another embodiment, an apparatus may include a source, a load, and a connector coupling the source and the load to deliver power from the source to the load through the connector. A power management circuit may include logic and/or circuitry that performs operations for controlling power within the apparatus, which may be a mobile device. The power management circuit may cause the execution of operations including receiving a first voltage value corresponding to a first voltage at a first side of a connector coupling a source to a load, a second voltage value corresponding to a second voltage at a second side of the connector, and a current value corresponding to current flow from the source to the load through the connector; determining a first impedance corresponding to the source based on the first voltage value and the current value; determining a second impedance corresponding to the connector based on the second voltage value and the current value; and/or controlling power consumption in the system based on the first impedance and the second impedance. The power management circuit may also perform any one or combination of operations described according to embodiments disclosed herein.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
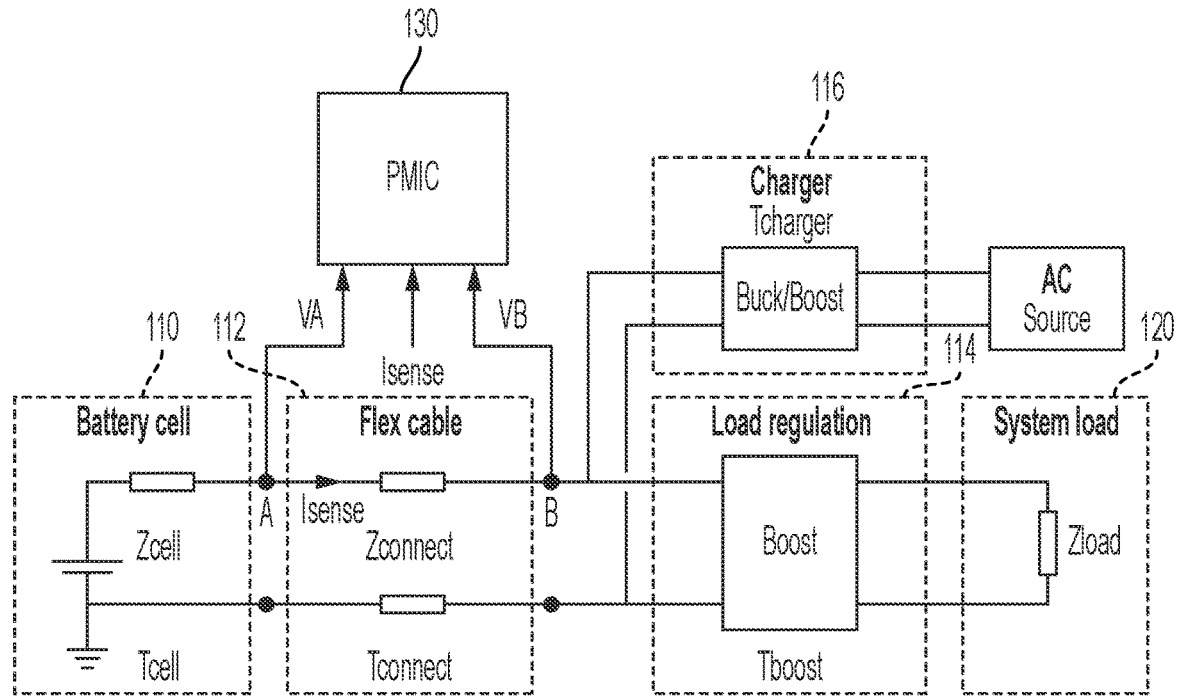
FIG. 1 is a block diagram illustrating an example electronic system with a flex connector according to one or more embodiments of the disclosure.

An example electronic system to which aspects of the power management and/or connector impedance estimation disclosed in this application may be applied are shown in FIG. 1. FIG. 1 is a block diagram illustrating an electronic system with a flex connector according to one or more embodiments of the disclosure. A load 120 may be coupled through load regulation 114 to a power source. One example power source is an AC adaptor coupled to the load regulation 114 through a charger 116. Another example power source is a battery cell 110 coupled to the load regulation 114 through flex connector or flex cable 112. Some impendences shown in the electronic system include the system load 120 impedance, $Z_{load}$, the battery cell 110 impedance, $Z_{cell}$, and the flex connector/cable 112 impedance, $Z_{connect}$. The components of the electronic system may also have different temperature levels indicated by $T_{boost}$ for load regulation 114, $T_{connector}$ for flex connector/cable 112, $T_{cell}$ for battery cell 110, and $T_{charger}$ for charger 116.

A power management circuit (PMIC) 130 may be coupled to one or more components or connections between the components to receive information about operation of the components of the electronic system and/or control operation of the components of the electronic system. For example, power management circuit 130 may be coupled to connection point A to measure a voltage $V_A$ at the battery cell 110 on a first side of the flex connector/cable 112. As another example, power management circuit 130 may be coupled to connection point B to measure a voltage VB at the load 120 on a second side of the flex connector/cable 112. The power management circuit 130 may also receive a value indicative of current $I_{sense}$ through the flex connector/cable 112. The power management circuit 130 may include logic to separately determine and/or separately track an impedance $Z_{cell}$ of the battery cell 110 and the impedance $Z_{connect}$ of the flex connector 112. In some embodiments, the power management circuit 130 may also include logic to separately determine and/or separately track an impedance $Z_{load}$ of the load 120.

The power management circuit 130 may be custom logic circuitry comprising, for example, multiplexers, AND gates, OR gates, and XOR gates to perform calculations based on received inputs from the connection points A and B. In some embodiments, the power management circuit 130 may be a microprocessor configured to execute firmware or other code to perform calculations based on received inputs from the connection points A and B. The logic circuitry or code may include criteria for executing certain power management functions, such as reducing a charging rate and/or adjusting power consumption by the load 120 through the load regulation 114. The criteria may be set by a system-level configuration, such as by an original equipment manufacturer (OEM), a kernel mode driver (KMD) executed as part of an operating system, and/or by user-level software executed by applications within an operating system.

Figure 2:
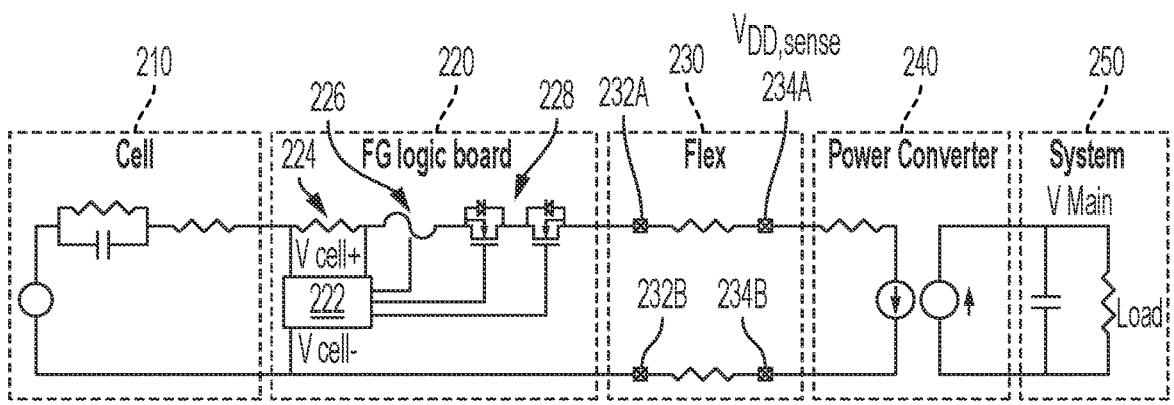
FIG. 2 is a circuit diagram illustrating an example electronic system with a flex connector according to one or more embodiments of the disclosure.

One circuit implementation of an electronic circuit for the electronic system of FIG. 1 is shown in FIG. 2. FIG. 2 is a circuit diagram illustrating an example electronic system with a flex connector according to one or more embodiments of the disclosure. A battery cell 210 may be represented by a voltage source with internal resistances. A fuel gauge (FG) logic board 220 may be coupled to the battery cell 210 to manage charging and discharging from the battery cell 210. The FG 220 may include an FG controller 222 coupled to a current sense resistor 224, a fuse 226, and protection field-effect-transistor (FET) transistors 228. A flex connector 230 couples the battery cell 210 to a system load 250. The system load 250 may be represented by a resistance and parallel capacitance. The system load 250 may be coupled to the flex connector 230 by a power converter 240, which may be configured to measure a voltage $V_{DD,sense}$ at node 234A. The voltage value at node 234A and a voltage value measured by FG controller 222 may be used as a voltage at a load-side of the flex connector 230 and a source-side of the flex connector 230, respectively. These two voltage values, and in some embodiments other values, may be used to determine separate impedances of the battery cell 210 and the flex connector 230 by a power management circuit 130 coupled to the power converter 240 and the FG controller 222.

Figure 3:
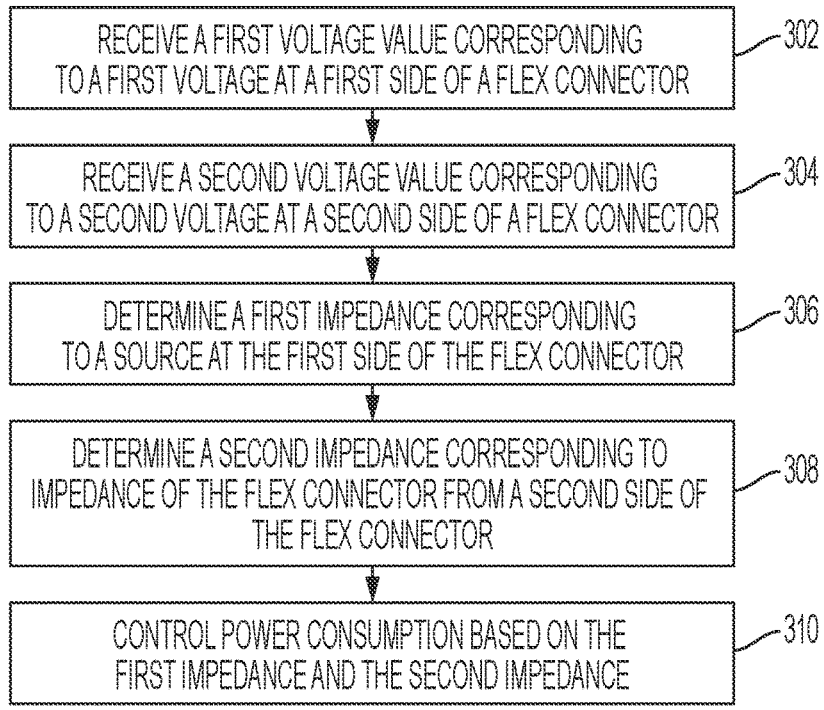
FIG. 3 is a flow chart illustrating an example method for power management in an electronic system, such as those of FIG. 1 or FIG. 2, according to one or more embodiments of the disclosure.

A method for separately tracking impedances of an electronic system, such as the system illustrated in FIG. 1 or FIG. 2, is shown in FIG. 3. FIG. 3 is a flow chart illustrating an example method for power management in an electronic system, such as those of FIG. 1 or FIG. 2, according to one or more embodiments of the disclosure.

At block 302, the method includes receiving a first voltage value corresponding to a first voltage at a first side of a connector coupling a source to a load. The first voltage value may be the $V_{cell}$ voltage sensed, e.g., at connection point A in FIG. 1, at a source-side of a connector. The $V_{cell}$ value may be measured by an FG controller 222 or by another component in contact with the battery cell 210. In some embodiments, the $V_{cell}$ value may be estimated rather than measured, such as when the FG controller 222 estimates the $V_{cell}$ voltage based on tracking charge in and out of the battery cell and/or tracking aging conditions of the battery cell 210.

At block 304, the method includes receiving a second voltage value corresponding to a second voltage at a second side of the connector. The second voltage value may be the $V_{sense}$ voltage sensed, e.g., at connection point B in FIG. 1, at a load-side of a connector. The $V_{sense}$ voltage may be measured by a component, such as the power converter 240 of FIG. 2. In some embodiments, the $V_{sense}$ voltage may be estimated by determining a current through the load and an impedance of the load.

In addition to receiving the first voltage at block 302 and the second voltage at block 304, the method may include receiving a current value corresponding to current flow from the source to the load through the connector. The current may be measured through either of the fuel-gauge sense resistor or the power converter sense resistor.

As described above, and in further detail below, the power management method may include separately tracking two impedances in the electronic system: a first impedance of a source (e.g., a battery cell) and a second impedance of the connector (e.g., a flex cable) between the source and a load.

At block 306, the method includes determining a first impedance corresponding to the source based on the first voltage value and the current value. Determining the first impedance at block 306 may include determining a first dynamic impedance having a first time constant corresponding to a rate of impedance change of the source. For example, determining the first dynamic impedance may include applying a first averaging filter with a first time constant to an impedance determined based on the first voltage value received at block 302 and the current value. An example embodiment of logic for determining the first impedance is described below with respect to first impedance estimator 410 of FIG. 4.

At block 308, the method includes determining a second impedance corresponding to the connector based on the second voltage value and the current value. Determining the second impedance at block 308 may include determining a second dynamic impedance having a second time constant corresponding to a rate of impedance change of the connector. For example, determining the second dynamic impedance may include applying a second averaging filter with a second time constant shorter than the first time constant to an impedance determined based on the second voltage value received at block 304 and the current value. An example embodiment of logic for determining the second impedance is described below with respect to second impedance estimator 420 of FIG. 4.

At block 310, the method includes controlling power consumption in the system based on the first impedance and the second impedance. The controlling may include determining an available maximum power to the load and controlling the load based on the available maximum power. In some embodiments, the controlling may include determining a first temperature corresponding to the source (or the load if the cells act as the source or the load); determining a second temperature of the connector based on the second impedance; and controlling at least one of the load or the source based on determining a difference between the first temperature and the second temperature exceeds a threshold level. In some embodiments, the control may include reducing a charging rate of a battery cell acting as a load when charged by a charger IC source through the connector. In some embodiments, the control may include reducing the loading rate of a battery cell acting as a source supplying power to a system load through the connector. An example embodiment of logic for controlling power consumption is described below with respect to power prediction 440 and power control logic 430 of FIG. 4.

Figure 4:
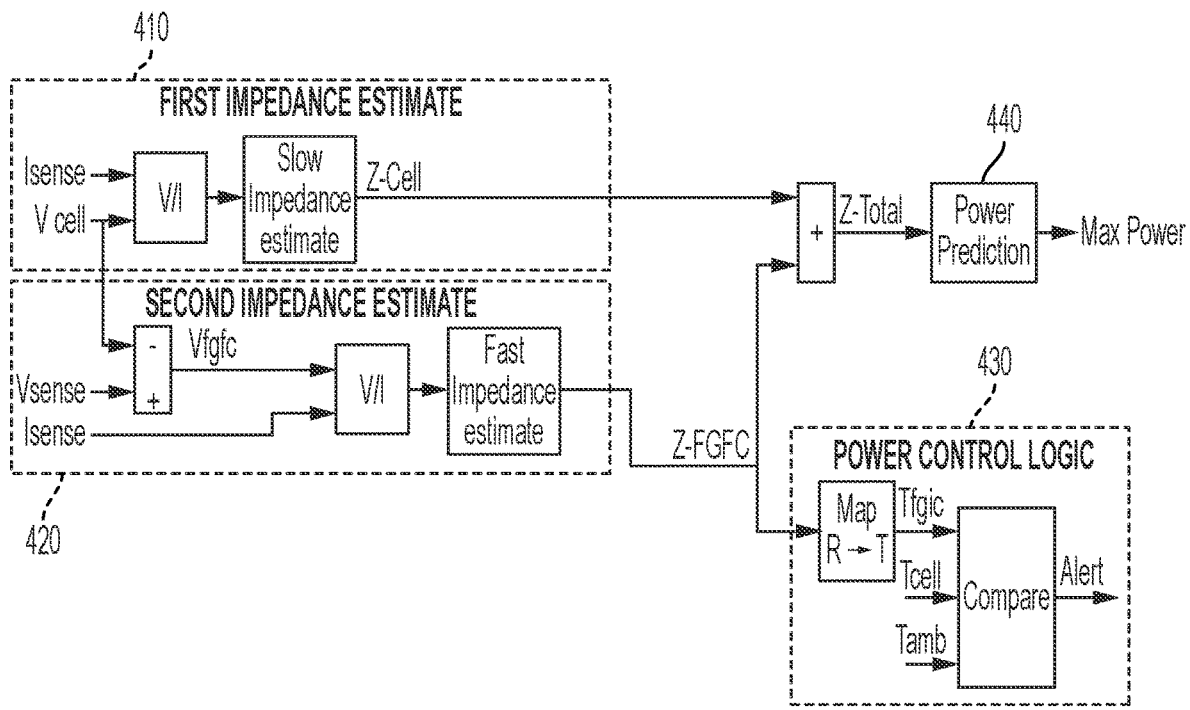
FIG. 4 is a block diagram illustrating an example technique for separately determining impedance estimates for an electronic system according to one or more embodiments of the disclosure.

One embodiment of the power management described in the method of FIG. 3 is in the logic shown in FIG. 4. FIG. 4 is a block diagram illustrating an example technique for separately determining impedance estimates for an electronic system according to one or more embodiments of the disclosure. Impedance estimators may execute logic to perform calculations based upon the $V_{cell}$, $V_{sense}$, and $I_{sense}$ values. A first impedance estimator 410 and a second impedance estimator 420 may determine and/or track different impedance values in the electronic system.

The first impedance estimator 410 determines an impedance of the battery cell $Z_{cell}$. The first impedance estimator 410 may receive a voltage $V_{cell}$ determined for a first source-side of a flex connector and may receive a current $I_{sense}$ through the flex connector. The measurements of $V_{cell}$ and $I_{sense}$ may be direct measurements of the described values or indirect measurements of other values that may be indicative of the described values. The first impedance estimator 410 may determine an impedance value based on the $I_{sense}$ and $V_{cell}$ values, such as by dividing $V_{cell}$ by $I_{sense}$, and inputting the immediate impedance value to a slow impedance estimator having a first time constant to estimate the cell impedance $Z_{cell}$. In some embodiments, the first impedance estimator 410 may include a slow averaging filter with time constant on the order of 10 minutes or less.

The second impedance estimator 420 may receive a voltage $V_{sense}$ determined for a second load-side of a flex connector and may receive a current $I_{sense}$ through the flex connector. The second impedance estimator 420 may determine an impedance value based on the $V_{sense}$ and $I_{sense}$ values. A voltage drop across the path may be computed as VFGFC by determining a difference between $V_{sense}$ and $V_{cell}$. The second impedance estimator 420 may then continue with dividing VFGFC by $I_{sense}$ and inputting the immediate impedance value to a fast impedance estimator having a second time constant to estimate the flex connector impedance $Z_{FGFC}$. The second time constant may be shorter than the first time constant of the first impedance estimator 410. In some embodiments, the second impedance estimator 420 may include a fast-averaging filter with time constant on the order of 10 seconds or less. The second impedance estimator 420 may perform tracking of the connector impedance as the power is applied on the connector. The connector impedance limits the power transfer but is also affected by the power transfer, such that the connector impedance is tracked with a relatively fast time constant relative to other slower changing impedance elements affecting power transfer in the system.

The determined impedances $Z_{cell}$ and $Z_{FGFC}$ may be used in power management logic to control an electronic system. For example, a power prediction 440 may receive a total impedance $Z_{total}$ as a combination of the first impedance $Z_{cell}$ and the second impedance $Z_{FGFC}$. The maximum power available may be determined from the $Z_{total}$ value, which may be a more accurate maximum determination than could be determined from the $Z_{cell}$ alone or the $Z_{cell}$ in combination with a fixed-value assumption for $Z_{FGFC}$. The maximum power determination may be used in logic circuitry to control a load and/or driver for the load to prevent overpower limit conditions in the electronic circuit. A power control logic 430 may monitor conditions in the electronic system based on one or more criteria. For example, logic 430 may monitor temperature to determine an alert should be triggered based on conditions satisfying the one or more criteria. In some embodiments, the logic 430 maps the flex connector impedance $Z_{FGFC}$ to a temperature $T_{FGIC}$. The logic 430 may also receive measurements or determinations of the battery cell temperature $T_{cell}$ and ambient temperature $T_{amb}$. The logic 430 may compare one or more of the $T_{FGIC}$, $T_{cell}$, and $T_{amb}$ temperatures to determine if, for example, a difference between one of the temperatures and another of the temperatures exceeds a threshold amount.

A large difference between the $T_{FGIC}$ and $T_{cell}$ values may indicate a large temperature gradient that may be dangerous for continued operation of the battery cell. If the FGFC temperature $T_{FGFC}$ differs too much from the cell temperature $T_{cell}$, then an alert condition is triggered to inform the system or a user of the system of a risk of abuse to the cell or system. A large temperature gradient between the FGFC and cell may correlate with a large temperature gradient inside the cell resulting in non-uniform current density that may prematurely age the cell. When the Alert signal is triggered, the power management logic may reduce the load or change to a lower charge profile for the battery cell to reduce the temperature gradient across the battery cell.

Figure 5:
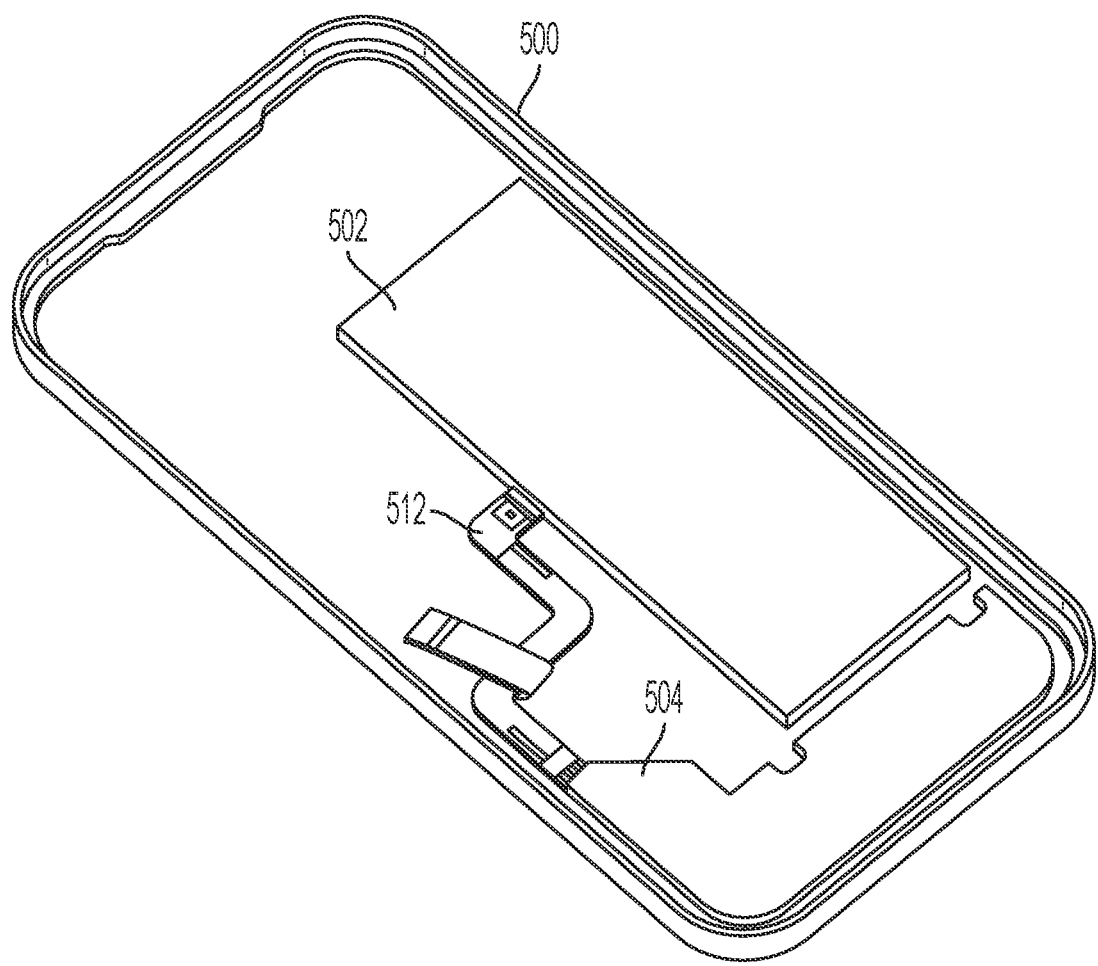
FIG. 5 is a perspective view of an example mobile device illustrating a flex connector for coupling two or more components according to one or more embodiments of the disclosure.

FIG. 5 is a perspective view of an example mobile device illustrating a flex connector for coupling two or more components according to one or more embodiments of the disclosure. A mobile device may implement the power management logic described in embodiments of this disclosure. A mobile device 500 may include a shell housing, a printed circuit board (PCB) coupling together several components to provide computing capability to a user for executing functions related to media playback, telephony, audio or video conferencing, Internet communications, and/or gaming. The components may be coupled to each other or to the printed circuit board through a flex connector 512 (e.g., a flex cable). In some embodiments, the flex connector 512 is a flat flexible cable (FFC). The flex connector 512 may couple a component 504 to a battery cell 502. An example component 504 may be an audio generation device, such as a speaker or audio control circuitry such as an audio controller. In other embodiments, the flex connector 512 may couple other sources and drains in the mobile device 500. In some embodiments, power management techniques described above may be applied to an electronic system in which a source is a battery cell, the load is an audio component, and the connector is a flex cable. In some embodiments, power management techniques described above may be applied to an electronic system in which a source is a speaker driver, a load is a speaker coil, and a connector is a flex cable.

The operations described above as performed by power control logic may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the power control logic may include other functionality. For example, a power control IC may include an audio coder/decoder (CODEC), an amplifier, a digital-to-analog converter (DAC), and/or an analog-to-digital converter (DAC) along with circuitry for performing the functions described herein. Such an IC is one example of an audio controller. Other audio functionality may be additionally or alternatively integrated with the IC circuitry described herein to form an audio controller.

If implemented in firmware and/or software, operations described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
receiving a first voltage value corresponding to a first voltage at a first side of a connector coupling a source to a load, a second voltage value corresponding to a second voltage at a second side of the connector, and a current value corresponding to current flow from the source to the load through the connector;
determining a first impedance corresponding to the source based on the first voltage value and the current value;
determining a second impedance corresponding to the connector based on the second voltage value and the current value; and
controlling power consumption in a system comprising the load, the source, and the connector, the controlling being based on the first impedance and the second impedance.

2. The method of claim 1, wherein:
determining the first impedance comprises determining a first dynamic impedance having a first time constant; and
determining the second impedance comprises determining a second dynamic impedance having a second time constant.

3. The method of claim 2, wherein:
determining the first dynamic impedance comprises applying a first averaging filter with the first time constant to an impedance determined based on the first voltage value and the current value; and
determining the second dynamic impedance comprises applying a second averaging filter with a second time constant shorter than the first time constant to an impedance determined based on the second voltage value and the current value.

4. The method of claim 3, wherein receiving the second voltage value comprises receiving a voltage measured at a load-side of a flex cable.

5. The method of claim 1, wherein controlling power consumption in the system comprises determining an available maximum power to the load and controlling the load based on the available maximum power.

6. The method of claim 1, wherein controlling power consumption in the system comprises:

determining a first temperature corresponding to the source;

determining a second temperature of the connector based on the second impedance; and controlling at least one of the load or the source based on determining a difference between the first temperature and the second temperature exceeding a threshold level.

7. The method of claim 6, wherein controlling at least one of the load or the source comprises reducing a charging rate for a battery cell.

8. An apparatus, comprising:

a memory storing computer-executable code;

at least one processor coupled to the memory and configured to execute the computer-executable code to perform operations comprising:

receiving a first voltage value corresponding to a first voltage at a first side of a connector coupling a source to a load, a second voltage value corresponding to a second voltage at a second side of the connector, and a current value corresponding to current flow from the source to the load through the connector;

determining a first impedance corresponding to the source based on the first voltage value and the current value;

determining a second impedance corresponding to the connector based on the second voltage value and the current value; and controlling power consumption in a system comprising the load, the source, and the connector, the controlling based on the first impedance and the second impedance.

9. The apparatus of claim 8, wherein:

determining the first impedance comprises determining a first dynamic impedance having a first time constant; and determining the second impedance comprises determining a second dynamic impedance having a second time constant.

10. The apparatus of claim 9, wherein:

determining the first dynamic impedance comprises applying a first averaging filter with the first time constant to an impedance determined based on the first voltage value and the current value; and determining the second dynamic impedance comprises applying a second averaging filter with the second time constant shorter than the first time constant to an impedance determined based on the second voltage value and the current value.

11. The apparatus of claim 10, wherein receiving the second voltage value comprises receiving a voltage measured at a load-side of a flex cable.

12. The apparatus of claim 8, wherein controlling power consumption in the system comprises determining an available maximum power to the load and controlling the load based on the available maximum power.

13. The apparatus of claim 8, wherein controlling power consumption in the system comprises:

determining a first temperature corresponding to the source;

determining a second temperature of the connector based on the second impedance; and controlling at least one of the load or the source based on determining a difference between the first temperature and the second temperature exceeding a threshold level.

14. A system, comprising:

a source;

a load;

a connector coupling the source and the load; and a power management circuit configured to perform operations comprising:

receiving a first voltage value corresponding to a first voltage at a first side of a connector coupling a source to a load, a second voltage value corresponding to a second voltage at a second side of the connector, and a current value corresponding to current flow from the source to the load through the connector;

determining a first impedance corresponding to the source based on the first voltage value and the current value;

determining a second impedance corresponding to the connector based on the second voltage value and the current value; and controlling power consumption in the system based on the first impedance and the second impedance.

15. The system of claim 14, wherein the source comprises a battery cell, the load comprises an audio component, and the connector comprises a flex cable.

16. The system of claim 15, wherein:

determining the first impedance comprises determining a first dynamic impedance having a first time constant corresponding to an impedance change of the battery cell; and determining the second impedance comprises determining a second dynamic impedance having a second time constant corresponding to an impedance change of the flex cable.

17. The system of claim 16, wherein:

determining the first dynamic impedance comprises applying a first averaging filter with the first time constant to an impedance determined based on the first voltage value and the current value; and determining the second dynamic impedance comprises applying a second averaging filter with the second time constant shorter than the first time constant to an impedance determined based on the second voltage value and the current value.

18. The system of claim 14, wherein the source comprises a speaker driver, the load comprises a speaker coil, and the connector comprises a flex cable.

19. The system of claim 18, wherein:

determining the first impedance comprises determining a first dynamic impedance having a first time constant corresponding to an impedance change of the speaker driver; and determining the second impedance comprises determining a second dynamic impedance having a second time constant corresponding to an impedance change of the flex cable.

20. The system of claim 19, wherein:

determining the first dynamic impedance comprises applying a first averaging filter with the first time constant to an impedance determined based on the first voltage value and the current value; and determining the second dynamic impedance comprises applying a second averaging filter with the second time constant shorter than the first time constant to an impedance determined based on the second voltage value and the current value.

* * * * *

UNITED STATES PATENT AND TRADEMARK OFFICE
CERTIFICATE OF CORRECTION

PATENT NO. : 12,445,771 B2  
APPLICATION NO. : 18/353092  
DATED : October 14, 2025  
INVENTOR(S) : Marchais et al.

Page 1 of 1

It is certified that error appears in the above-identified patent and that said Letters Patent is hereby corrected as shown below:

In the Specification

In Column 2, Line 26, delete "and or" and insert -- and/or --, therefor.

In Column 4, Line 64, delete "impedences" and insert -- impedances --, therefor.

In Column 5, Line 14, delete "VB" and insert -- $V_B$ --, therefor.

In Column 7, Line 48, delete "VFGFC" and insert -- $V_{FGFC}$ --, therefor.

In Column 7, Line 50, delete "VFGFC" and insert -- $V_{FGFC}$ --, therefor.

In Column 8, Line 12, delete "an" and insert -- that an --, therefor.

In Column 8, Line 30, delete "non-unform" and insert -- non-uniform --, therefor.

In Column 9, Line 4, delete "hard-wire" and insert -- hard-wired --, therefor.

In Column 9, Line 19, delete "(DAC)" and insert -- (ADC) --, therefor.

Signed and Sealed this  
Third Day of February, 2026

John A. Squires  
*Director of the United States Patent and Trademark Office*